United States Patent
Shimada et al.

(10) Patent No.: US 11,280,406 B2
(45) Date of Patent: Mar. 22, 2022

(54) ROTARY ACTUATOR

(71) Applicant: DENSO CORPORATION, Kariya (JP)

(72) Inventors: Kazunori Shimada, Kariya (JP);
Mikine Kume, Kariya (JP); Hiroyuki Kado, Kariya (JP)

(73) Assignee: DENSO CORPORATION, Kariya (JP)

( * ) Notice: Subject to any disclaimer, the term of this patent is extended or adjusted under 35 U.S.C. 154(b) by 77 days.

(21) Appl. No.: 16/841,971

(22) Filed: Apr. 7, 2020

(65) Prior Publication Data

US 2020/0340578 A1 Oct. 29, 2020

(30) Foreign Application Priority Data

Apr. 24, 2019 (JP) .............................. JP2019-083279

(51) Int. Cl.
| | |
|---|---|
| *F16H 61/32* | (2006.01) |
| *H05K 5/06* | (2006.01) |
| *H02K 19/02* | (2006.01) |
| *F16H 63/34* | (2006.01) |

(52) U.S. Cl.
CPC ......... *F16H 61/32* (2013.01); *F16H 63/3466* (2013.01); *H02K 19/02* (2013.01); *H05K 5/06* (2013.01); *F16H 2061/326* (2013.01)

(58) Field of Classification Search
CPC ................. F16H 61/32; F16H 63/3466; F16H 2061/326; F16H 2057/02026; F16H 61/0006; F16H 61/0204; F16H 59/08; F16H 1/32; F16H 2001/327; H05K 5/06; H02K 19/02; H02K 5/1732; H02K 7/14; H02K 7/116; H02K 11/215; H02K 2211/03; H02K 11/33; H02K 7/10; H02K 5/04; H02K 11/30
See application file for complete search history.

(56) References Cited

U.S. PATENT DOCUMENTS

| | | | |
|---|---|---|---|
| 8,816,551 B2* | 8/2014 | Oishi | ...................... H02K 15/02 310/71 |
| 9,236,780 B2* | 1/2016 | Oishi | ...................... F16C 35/077 |
| 2013/0234548 A1* | 9/2013 | Oishi | ...................... H02K 5/225 310/71 |

FOREIGN PATENT DOCUMENTS

| | | | |
|---|---|---|---|
| JP | 2000-313346 | | 11/2000 |
| JP | 2010-032470 | | 2/2010 |
| KR | 20080070928 A | * | 8/2008 |

OTHER PUBLICATIONS

U.S. Appl. No. 16/841,808, to Makino, et al., entitled: "Rotary Actuator", filed Apr. 7, 2020 (27 pages).
U.S. Appl. No. 16/841,808, filed Apr. 7, 2020, Rotary Actuator.

* cited by examiner

*Primary Examiner* — Victor L MacArthur
(74) *Attorney, Agent, or Firm* — Nixon & Vanderhye P.C.

(57) ABSTRACT

A rotary actuator includes: an electric motor; a control unit, which is configured to control an operation of the electric motor; a case, which is made of resin and receives the electric motor; and a circuit-board fixture. The circuit-board fixture includes an insertion portion, which is embedded at an upper case segment of the case, and a fixation portion, which is made of metal and fixes a circuit board of the control unit.

11 Claims, 7 Drawing Sheets

ROTARY ACTUATOR

CROSS REFERENCE TO RELATED APPLICATIONS

This application is based on and incorporates herein by reference Japanese Patent Application No. 2019-083279 filed on Apr. 24, 2019.

TECHNICAL FIELD

The present disclosure relates to a rotary actuator.

BACKGROUND

Conventionally, in a case where a circuit board is received at an inside space, which is defined between a case main body and a cover, the circuit board is fixed to the case main body.

For example, according to one previously proposed technique, a circuit case includes a case main body and a cover, which are both made of synthetic resin, and a circuit board is received between the case main body and the cover. A plurality of fixation portions are formed integrally with the case main body in one piece. The fixation portions are respectively inserted through holes of the circuit board, and tips of the mounting portions are melted by heat and are plastically deformed against the circuit board to fix the circuit board relative to the case main body.

The fixation portions made of the resin have a relatively small fixation force in a thickness direction of the circuit board, which is perpendicular to a plane of the circuit board. Therefore, when an external force, which is generated by vibrations of the circuit board or thermal expansion of the circuit board in the thickness direction thereof, is applied to the fixation portions, the fixation portions may possibly be deformed or damaged.

SUMMARY

This section provides a general summary of the disclosure, and is not a comprehensive disclosure of its full scope or all of its features.

According to the present disclosure, there is provided a rotary actuator. The rotary actuator includes a circuit-board fixture that is held by a case made of resin and includes a fixation portion, which is made of metal and fixes a circuit board of a control unit.

BRIEF DESCRIPTION OF DRAWINGS

The drawings described herein are for illustrative purposes only of selected embodiments and not all possible implementations, and are not intended to limit the scope of the present disclosure.

DETAILED DESCRIPTION

Figure 1:
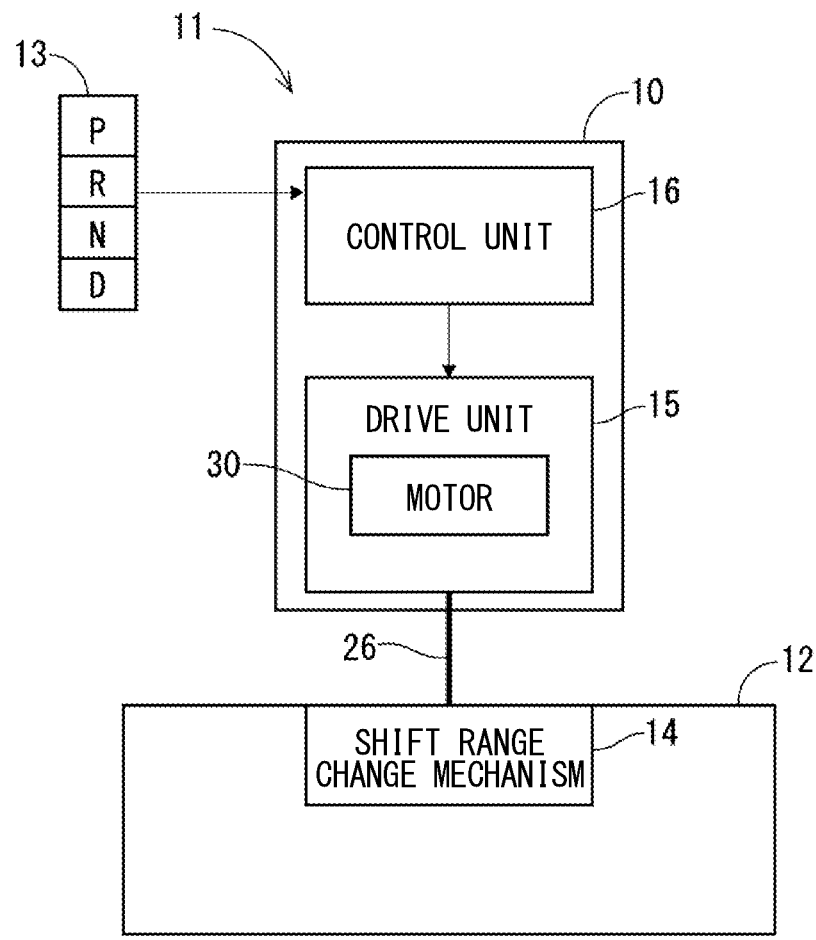
FIG. 1 is a schematic diagram showing a shift-by-wire system that includes a rotary actuator according to a first embodiment.

For example, according to one previously proposed technique, a circuit case includes a case main body and a cover, which are both made of synthetic resin, and a circuit board is received between the case main body and the cover. A plurality of mounting portions are formed integrally with the case main body in one piece. The mounting portions (serving as heat-swaging fixation portions) are respectively inserted through holes of the circuit board, and tips of the mounting portions are melted by heat and are plastically deformed against the circuit board to fix the circuit board relative to the case main body.

The heat-swaging fixation portions made of the resin have a relatively small fixation force in a thickness direction of the circuit board, which is perpendicular to a plane of the circuit board. Therefore, when an external force, which is generated by vibrations of the circuit board or thermal expansion of the circuit board in the thickness direction thereof, is applied to the heat-swaging fixation portions, the melted and solidified parts of the tips of the heat-swaging fixation portions may possibly be deformed or damaged. When the melted and solidified parts are deformed or damaged, the fixation force for fixing the circuit board relative to the case main body is lost to cause a damage or an electrical conduction failure of the circuit board.

According to the present disclosure, there is provided a rotary actuator for a shift-by-wire system of a vehicle. The rotary actuator includes: an electric motor; a control unit, which is configured to control an operation of the electric motor; a case that is made of resin and receives the electric motor; and a circuit-board fixture. The circuit-board fixture includes an insertion portion, which is embedded at the case, and a fixation portion, which is made of metal and fixes a circuit board of the control unit.

According to the present disclosure, the fixation portion is made of the metal, so that in comparison to a case where the circuit board is fixed to the case made of the resin by the heat swaging, it is possible to limit the deformation and the damage of the fixation portion even when the external force, which is generated by the vibrations of the circuit board or the thermal expansion of the circuit board in the thickness direction thereof, is applied to the fixation portion. Thereby, since the fixation force for fixing the circuit board to the case main body is not easily lost, the damage or the electrical conduction failure of the circuit board of the control unit is advantageously limited.

Hereinafter, a rotary actuator according to various embodiments of the present disclosure will be described with reference to the accompanying drawings. Portions, which are common among the embodiments, will be indicated by the same reference signs and will not be described redundantly.

First Embodiment

The rotary actuator is used as a drive device of a shift-by-wire system of a vehicle.

Shift-by-Wire System

First of all, a structure of the shift-by-wire system will be described with reference to FIGS. 1 and 2. As shown in FIG. 1, the shift-by-wire system 11 includes: a shift manipulation device 13, which commands a shift range of a transmission 12; and a rotary actuator (hereinafter referred to as an actuator) 10, which drives a shift range change mechanism 14 of the transmission 12. The actuator 10 includes: a drive unit 15, which has an electric motor 30; and a control unit 16, which controls an operation of the electric motor 30 based on a command signal that is outputted from the shift manipulation device 13 and commands the shift range.

Figure 2:
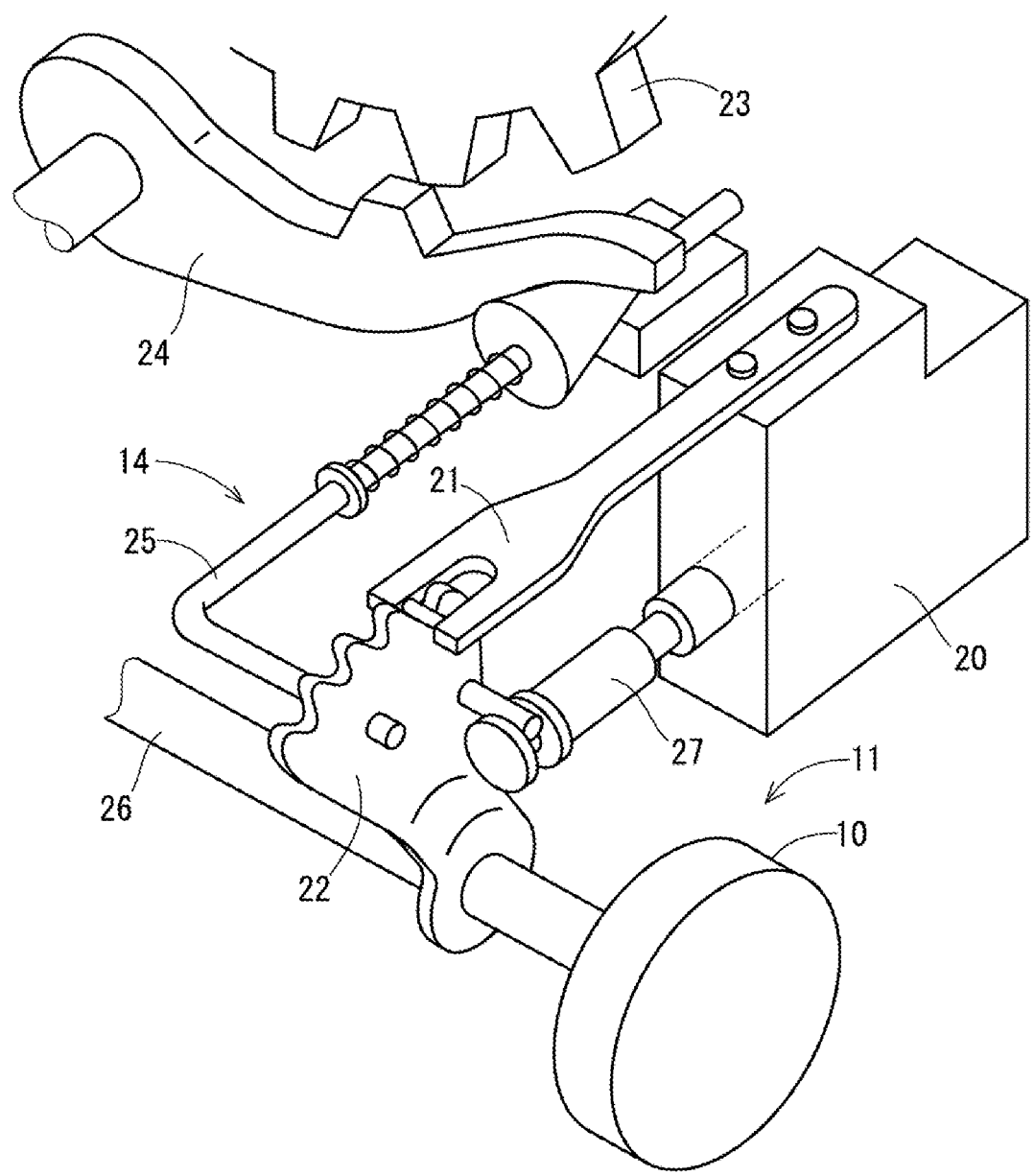
FIG. 2 is a diagram for describing a shift range change mechanism shown in FIG. 1 according to the first embodiment.

As shown in FIG. 2, the shift range change mechanism 14 includes: a range shift valve 20, which controls supply of an oil pressure to a hydraulic mechanism in the transmission 12 (see FIG. 1); a detent spring 21 and a detent lever 22, which cooperate together to hold a corresponding shift range; a park rod 25 that locks rotation of an output shaft of the transmission 12 by fitting a park pole 24 to a park gear 23 of the output shaft of the transmission 12 when the shift range is changed to a parking range; and a manual shaft 26, which is rotated integrally with the detent lever 22.

The shift range change mechanism 14 moves each of a valve element 27 of the range shift valve 20 and the park rod 25, which are coupled to the detent lever 22, to a corresponding position that corresponds to a target range by rotating the detent lever 22 along with the manual shaft 26. In the shift-by-wire system 11, the actuator 10 is connected to the manual shaft 26 to electrically change the shift range.

Actuator

Figure 3:
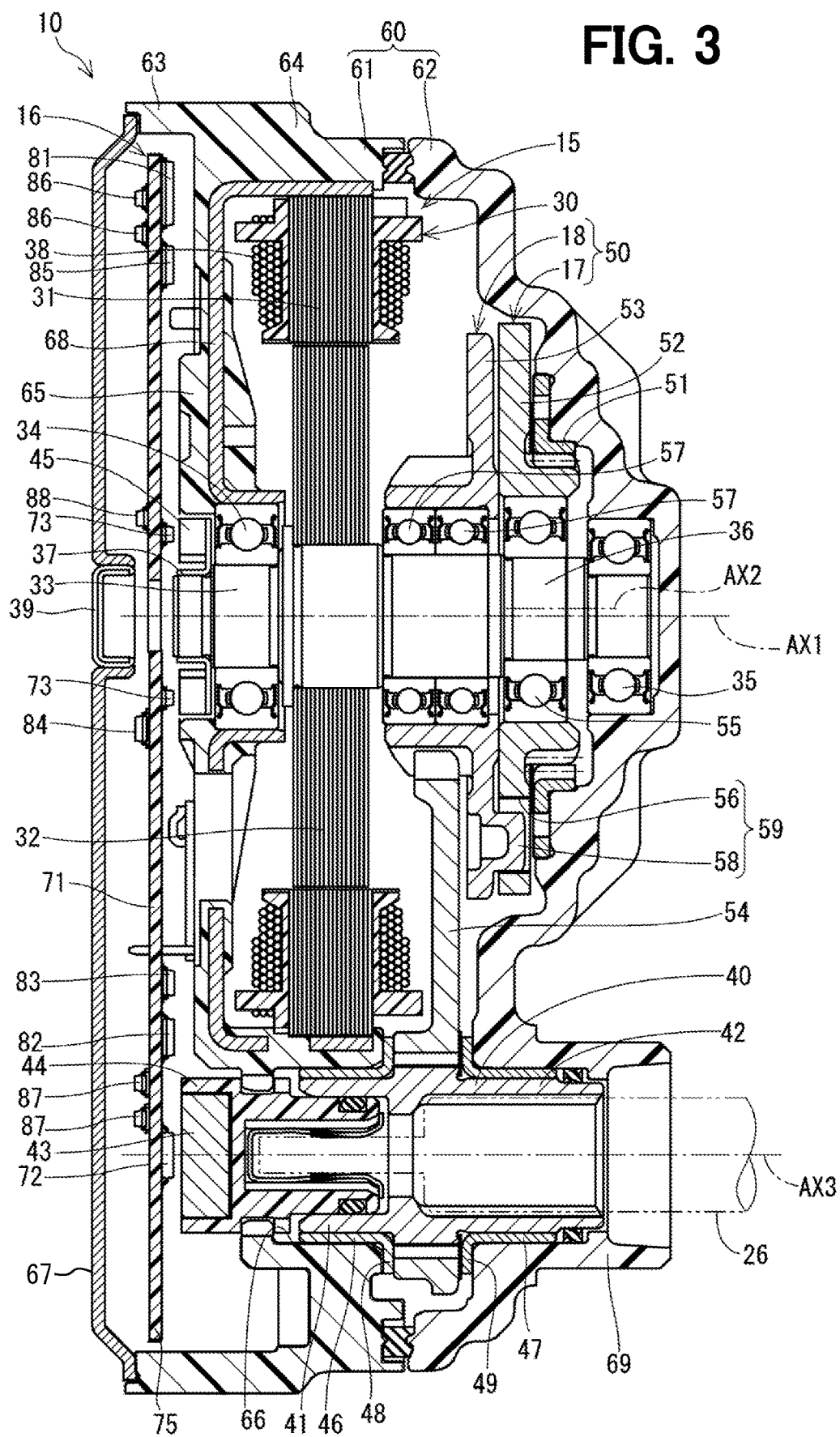
FIG. 3 is a cross-sectional view of the rotary actuator according to the first embodiment.
Figure 4:
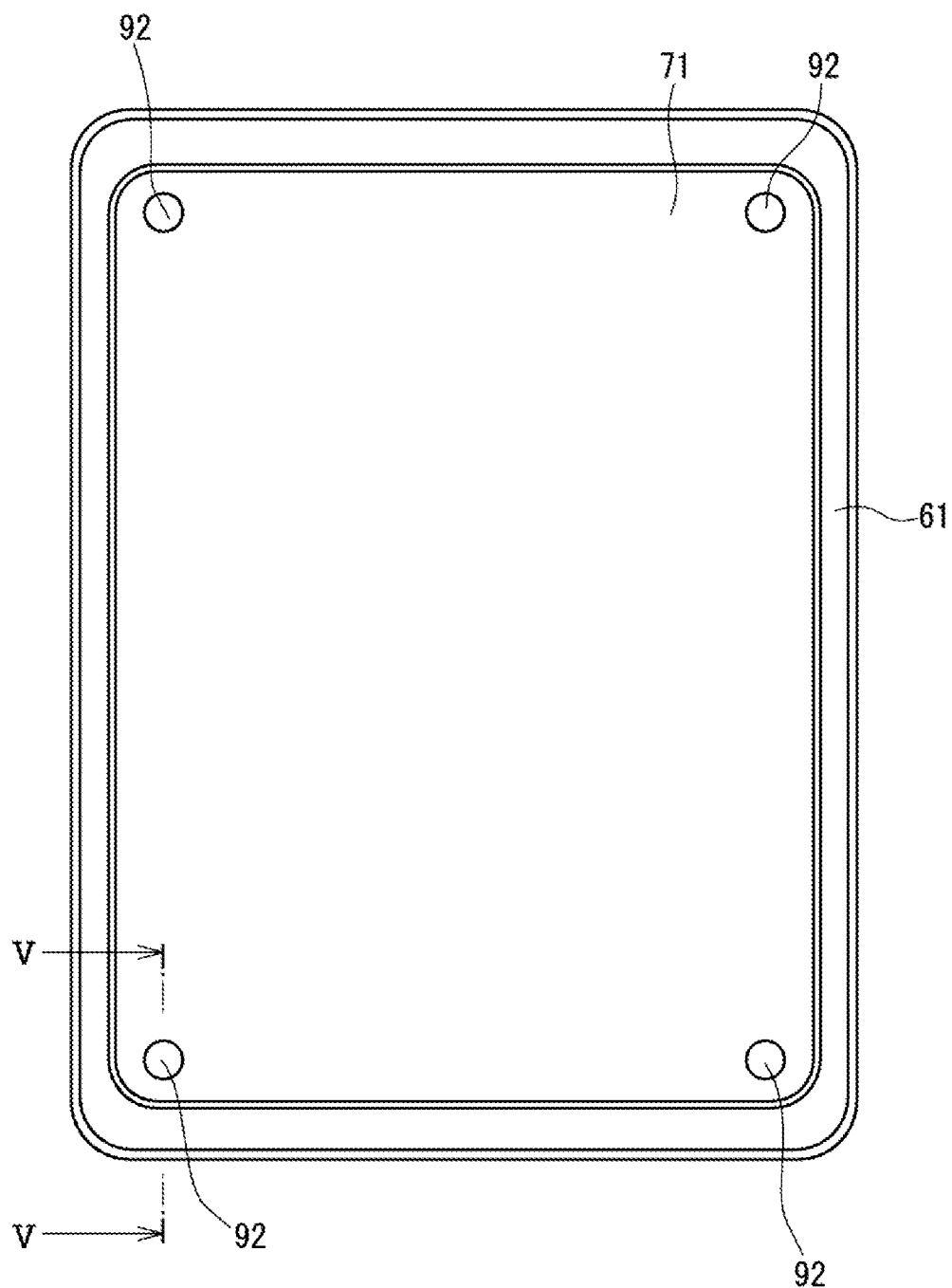
FIG. 4 is a schematic plan view of a case and a circuit board of the rotary actuator shown in FIG. 3 according to the first embodiment.

Next, the structure of the actuator 10 will be described. As shown in FIGS. 3 and 4, the actuator 10 is an integrated electromechanical actuator that includes the drive unit 15 and the control unit 16 while the drive unit 15 and the control unit 16 are received in a case 60.

The case 60 is made of resin. The case 60 includes an upper case segment 61, which is shaped in a tubular form, and a lower case segment 62, which is shaped in a cup form. One end portion 63 of the upper case segment 61 forms an opening of the case 60. A partition wall 65 is formed between the one end portion 63 and the other end portion 64 of the upper case segment 61. A circuit board 71 is installed at an inside of the one end portion 63. The circuit board 71 is made of glass epoxy. The circuit board 71 is covered with a plate cover 67 that is installed to an opening end of the one end portion 63, so that a required shielding performance for shielding the circuit board 71 is ensured. The lower case segment 62 is assembled to the other end portion 64. The lower case segment 62 forms a tubular projection 69 that projects to an opposite side that is opposite from the upper case segment 61. The manual shaft 26 is placed such that the manual shaft 26 is inserted through the tubular projection 69.

The drive unit 15 includes: the electric motor 30, which serves as a drive source; an output shaft 40, which extends in parallel with a rotational axis AX1 of the electric motor 30; and a speed reducer mechanism 50, which reduces a speed of rotation outputted from the electric motor 30 and transmits the rotation of reduced speed to the output shaft 40.

The electric motor 30 includes: a stator 31, which is securely press fitted to a plate case 68 of the other end portion 64; a rotor 32, which is placed on a radially inner side of the stator 31; and a motor shaft 33 that is rotated together with the rotor 32 about the rotational axis AX1. The motor shaft 33 is rotatably supported by a bearing 34, which is installed to the plate case 68, and a bearing 35, which is installed to the lower case segment 62. Furthermore, the motor shaft 33 has an eccentric portion 36. The eccentric portion 36 is placed at the lower case segment 62 side of the rotor 32 and is eccentric to the rotational axis AX1. The electric motor 30 can be rotated in each of forward and backward directions and can be stopped at a desirable rotational position by controlling the supply of the electric current to coils 38 of the stator 31 through the control unit 16. A plug 39 is installed in a through-hole of the plate cover 67. In an event of a failure of the actuator 10, the plug 39 can be removed to enable manual rotation of the motor shaft 33.

The speed reducer mechanism 50 includes a first speed reducer 17 and a second speed reducer 18. The first speed reducer 17 includes a ring gear 51 and a sun gear 52. The second speed reducer 18 is a parallel axis type and includes a drive gear 53 and a driven gear 54 while a rotational axis of the drive gear 53 and a rotational axis of the driven gear 54 are parallel to each other. The ring gear 51 is placed about the rotational axis AX1. The sun gear 52 is rotatably supported by a bearing 55 fitted to the eccentric portion 36, so that the sun gear 52 is rotatable about an eccentric axis AX2 and is meshed with the ring gear 51 at the inside of the ring gear 51. When the motor shaft 33 is rotated, the sun gear 52 makes a planetary motion such that the sun gear 52 revolves about the rotational axis AX1 and rotates about the eccentric axis AX2. At this time, a rotational speed of the sun gear 52 is reduced relative to a rotational speed of the motor shaft 33. The sun gear 52 has a hole 56 for transmitting the rotation to the drive gear 53.

The drive gear 53 is placed along the rotational axis AX1 and is rotatably supported by a bearing 57, which is fitted to the motor shaft 33, such that the drive gear 53 rotates about the rotational axis AX1. The drive gear 53 has a projection 58, which is inserted into the hole 56 of the sun gear 52 to transmit the rotation between the sun gear 52 and the drive gear 53. The rotation of the sun gear 52 is transmitted to the drive gear 53 through the engagement between the hole 56 and the projection 58. The hole 56 and the projection 58 form a transmission mechanism 59. The driven gear 54 is placed along a rotational axis AX3, which is parallel with the rotational axis AX1 and is coaxial with the tubular projection 69, such that the driven gear 54 is meshed with the drive gear 53 at an outside of the drive gear 53. When the drive gear 53 is rotated about the rotational axis AX1, the driven gear 54 is rotated about the rotational axis AX3. The rotational speed of the driven gear 54 is reduced in comparison to the rotational speed of the drive gear 53.

The output shaft 40 is shaped in a tubular form and is placed about the rotational axis AX3. The partition wall 65 has a supporting through hole 66 that is coaxial with the rotational axis AX3. The output shaft 40 is supported by a first flanged bush 46, which is fitted into the supporting through hole 66, and a second flanged bush 47, which is fitted to the inside of the tubular projection 69, such that the output shaft 40 is rotatable about the rotational axis AX3. The driven gear 54 is a separate member formed separately from the output shaft 40 and is fitted to the output shaft 40 at an outside of the output shaft 40 such that the driven gear 54 is coupled to the output shaft 40 to transmit the rotation between the driven gear 54 and the output shaft 40. The manual shaft 26 is inserted into the inside of the output shaft 40 and is coupled to the output shaft 40 by, for example, spline fitting such that the output shaft 40 can transmit the rotation to the manual shaft 26.

One end portion 41 of the output shaft 40 is rotatably supported by the first flanged bush 46. The other end portion 42 of the output shaft 40 is rotatably supported by the second flanged bush 47. The driven gear 54 is axially supported by a first flange 48 of the first flanged bush 46 and a second flange 49 of the second flanged bush 47 while the driven gear 54 is held between the first flange 48 and the second flange 49. In another embodiment, the driven gear 54 may be axially supported by a pair of support portions, such as the case 60 and/or another plate.

The control unit 16 includes: a plurality of electronic components, which are configured to control the operation of the electric motor 30; the circuit board 71, to which the electronic components are installed; an output shaft position sensor 72, which is installed to the circuit board 71; and a plurality of motor position sensors 73, which are installed to the circuit board 71.

The electronic components include a plurality of microcomputers 81, a set of MOSFETs 82, a capacitor 83, a diode 84, an ASIC 85, an inductor 86, a resistor 87, a capacitor chip 88 and the like.

The output shaft position sensor 72 is placed at the circuit board 71 such that the output shaft position sensor 72 is opposed to a magnet 43. The magnet 43 is fixed to a holder 44 installed to the output shaft 40. The output shaft position sensor 72 senses the rotational position of the output shaft 40 and of the manual shaft 26, which are rotated together, by sensing a magnetic flux generated by the magnet 43.

The motor position sensors 73 are placed at the circuit board 71 such that the motor position sensors 73 are opposed to a magnet 45. The magnet 45, which is in a ring form, is fixed to a holder 37 that is installed to the motor shaft 33. The motor position sensors 73 sense the rotational position of the motor shaft 33 and of the rotor 32 by sensing a magnetic flux generated from the magnet 45.

Circuit Board, Upper Case Segment

Next, a plurality of circuit-board fixtures 92, which fix the circuit board 71 to the upper case segment 61, will be described along with its peripheral area. As shown in FIG. 4, the actuator 10 includes the plurality of circuit-board fixtures 92 that are placed at an outer peripheral portion of the circuit board 71.

Figure 5:
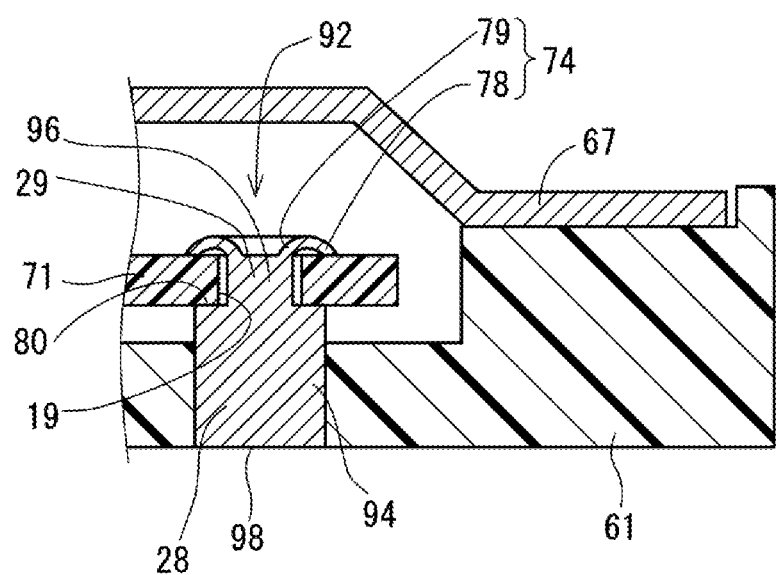
FIG. 5 is a cross-sectional view taken along line V-V in FIG. 4 according to the first embodiment.

As shown in FIG. 5, each of the circuit-board fixtures 92 includes an insertion portion 94, which is embedded at the upper case segment 61, and a fixation portion (also referred to as a swaging fixation portion) 96, which fixes the circuit board 71 of the control unit 16 relative to the upper case segment 61. The circuit-board fixture 92 is made of aluminum. The insertion portion 94 is insert molded in the upper case segment 61 in an insert molding process. An end surface 98 of the insertion portion 94, which is opposite to the fixation portion 96, is exposed at a surface of the upper case segment 61. The fixation portion 96 of the circuit-board fixture 92 extends through the circuit board 71 in a thickness direction of the circuit board 71. Here, the thickness direction is defined as a direction that is perpendicular to a plane of the circuit board 71. The circuit board 71 has a plurality of holes 19, each of which extends through the circuit board 71 in the thickness direction of the circuit board 71. The fixation portion 96 of each circuit-board fixture 92 extends through a corresponding one of the holes 19 toward the plate cover 67 and is swaged against the circuit board 71 to fix the circuit board 71 relative to the upper case segment 61.

Figure 6:
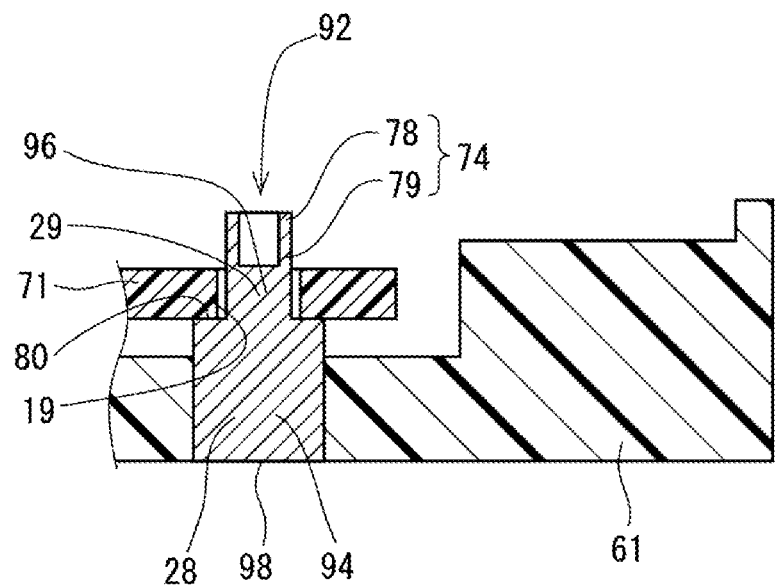
FIG. 6 is a schematic cross sectional view corresponding to FIG. 5 and showing a state before the time of swaging a fixation portion according to the first embodiment.

As shown in FIG. 6, in a state before the swaging of the fixation portion 96, the circuit-board fixture 92 has a large diameter cylindrical portion 28, a small diameter cylindrical portion 29 and a tubular portion 74. The large diameter cylindrical portion 28 includes the insertion portion 94. A cross-sectional area of the small diameter cylindrical portion 29 is smaller than a cross-sectional area of the large diameter cylindrical portion 28. The small diameter cylindrical portion 29 and the tubular portion 74 are arranged along an axis of the large diameter cylindrical portion 28. The large diameter cylindrical portion 28, the small diameter cylindrical portion 29 and the tubular portion 74 are arranged in this order from the insertion portion 94 side toward the circuit board 71 side. An outer peripheral surface of the small diameter cylindrical portion 29 and an outer peripheral surface of the tubular portion 74 are connected with each other in the axial direction. An outer peripheral surface of the large diameter cylindrical portion 28 and an outer peripheral surface of the small diameter cylindrical portion 29 are connected with each other while a step 80 is formed between the outer peripheral surface of the large diameter cylindrical portion 28 and the outer peripheral surface of the small diameter cylindrical portion 29. The step 80 is placed at a location that projects from a surface of the upper case segment 61. The circuit board 71 is supported by the step 80 of each circuit-board fixture 92. The small diameter cylindrical portion 29 is placed in the corresponding hole 19. The tubular portion 74 has one end part 78 and another end part 79. The other end part 79 is joined to the small diameter cylindrical portion 29. The tubular portion 74 is swaged, i.e., is plastically deformed against the periphery of the hole 19. Therefore, the tubular portion 74 is plastically deformed to expand along a plane of the circuit board 71 in a state where the circuit board 71 is clamped between the expanded part of the tubular portion 74 and the step 80. The one end part 78 of the tubular portion 74 exerts a fixed load in a direction perpendicular to the plane of the circuit board 71. The circuit board 71 is clamped and is fixed between the one end part 78 and the step 80 of each of the circuit-board fixtures 92 by the swaging of the tubular portion 74. The tubular portion 74 is swaged, i.e., is plastically deformed in the above described manner, and thereby the circuit board 71 is fixed relative to the upper case segment 61.

A diameter of the small diameter cylindrical portion 29 is smaller than a diameter of the hole 19. The small diameter cylindrical portion 29 limits movement of the circuit board 71 in a direction parallel to the plane of the circuit board 71. The fixation portions 96 of the circuit-board fixtures 92 position the circuit board 71 relative to the upper case segment 61.

Advantages

As described above, the rotary actuator 10 includes the circuit-board fixtures 92. Each of the circuit-board fixtures 92 includes the insertion portion 94, which is embedded at the upper case segment 61, and the fixation portion 96, which is made of the metal and fixes the circuit board 71 of the control unit 16 relative to the upper case segment 61.

(1) As discussed above, the fixation portion 96 of each of the circuit-board fixtures 92 is made of the metal, so that in comparison to a case where the circuit board 71 is fixed to the upper case segment made of the resin by the heat swaging (more specifically, by the heat swaging of the fixation portions formed integrally in one piece with the upper case segment made of the resin), it is possible to limit the deformation and the damage of the fixation portion 96 even when an external force, which is generated by vibrations of the circuit board 71 or the thermal expansion of the circuit board 71 in the thickness direction thereof, is applied to the fixation portion 96. Thereby, since the fixation force for fixing the circuit board 71 to the upper case segment 61 main body is not easily lost, the damage or the electrical conduction failure of the circuit board 71 of the control unit 16 is advantageously limited.

(2) The fixation portions 96 of the circuit-board fixtures 92 are swaged against the circuit board 71 to fix the circuit board 71 relative to the upper case segment 61 through the swaging process. In comparison to a case where the circuit board 71 is fixed to the upper case segment 61 with screws, the swaging of the fixation portions 96 can save the time and the space required for the fixation of the circuit board 71 relative to the upper case segment 61.

(3) The circuit board 71 is made of the glass epoxy, and the circuit-board fixture 92 is made of aluminum. The linear expansion coefficient of the circuit board 71 made of the glass epoxy in the thickness direction of the circuit board 71 is 40 to 70. The linear expansion coefficient of iron is 11.7. The linear expansion coefficient of aluminum is 23.8. The linear expansion coefficient of resin is 10 to 80. Conventionally, the circuit board is fixed to the case through the heat-swaging fixation portions, which are formed integrally in one piece with the case main body made of the resin and are swaged, i.e., are plastically deformed by heat swaging against the circuit board to fix the circuit board relative to the case. However, thermal stress is generated at the circuit board in the thickness direction of the circuit board due to the difference in the linear expansion coefficient between the case and the circuit board when the temperature changes. When such an external force is applied for a long time, the heat-swaging fixation portions, which are made of the resin and are plastically deformed against the circuit board 71 by the heat swaging, may possibly be deformed or damaged by creep. That is, there is a possibility of that the fixation force for fixing the circuit board to the case main body is lost to cause the damage or the electrical conduction failure of the circuit board. In contrast, according to the first embodiment, each of the circuit-board fixtures 92 has the fixation portion 96 made of aluminum, so that it is possible to avoid the deformation and the damage that would be otherwise caused by the creep generated at the resin. The linear expansion coefficient of aluminum is closer to the linear expansion coefficient of the circuit board 71 in the thickness direction of the circuit board 71 in comparison to the linear expansion coefficient of iron. Therefore, it is possible to reduce a difference in the size change in the thickness direction of the circuit board 71 between the fixation portion 96 and the circuit board 71 at the time when the temperature changes. Specifically, it is possible to limit the generation of the thermal stress.

(4) The end surface 98 of the insertion portion 94, which is opposite to the fixation portion 96, is exposed at the surface of the upper case segment 61. By supporting the end surface 98 exposed at the surface of the upper case segment 61 at the time of swaging, it is possible to avoid application of a load to the upper case segment 61.

(5) The one end part 78 is swaged, i.e., is plastically deformed against the periphery of the hole 19 by applying the fixed load in the direction perpendicular to the plane of the circuit board 71. Thereby, the fixation is eased.

(6) The fixation portions 96 of the circuit-board fixtures 92 position the circuit board 71 relative to the upper case segment 61. Therefore, there is no need to provide a separate component for positioning the circuit board 71, and thereby the size reduction is possible.

Second Embodiment

Figure 7:
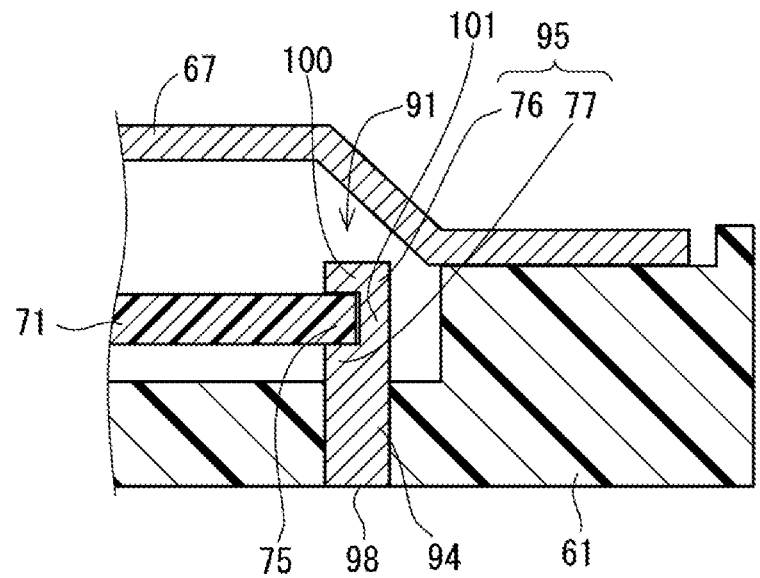
FIG. 7 is a schematic cross sectional view around a circuit-board fixture according to a second embodiment.

The second embodiment is similar to the first embodiment except the following construction. As shown in FIG. 7, a fixation portion (also referred to as a swaging fixation portion) 95 of each of the circuit-board fixtures 91 made of aluminum is swaged against the circuit board 71 to fix the circuit board 71 relative to the upper case segment 61. Here, the fixation portion 95 of each of the circuit-board fixtures 91 is swaged against an outer peripheral edge 75 of the circuit board 71.

Figure 8:
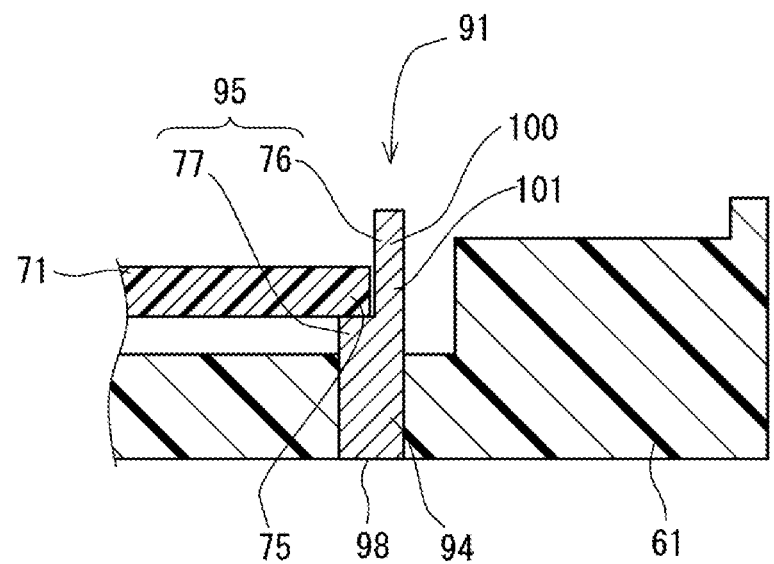
FIG. 8 is a schematic cross sectional view corresponding to FIG. 7 and showing a state before the time of swaging a fixation portion according to the second embodiment.

As shown in FIG. 8, in the state before the swaging of the fixation portions 95 against the outer peripheral edge 75 of the circuit board 71, each of the fixation portions 95 has a projection 76 and a supporting base 77 while the supporting base 77 and the projection 76 project away from the insertion portion 94 and are arranged in this order in the direction perpendicular to the plane of the circuit board 71. The projection 76 of each fixation portion 95 is located on an outer side of the circuit board 71 in a direction parallel to the plane of the circuit board 71. The supporting base 77 supports the outer peripheral edge 75 of the circuit board 71. The projection 76 includes a distal end segment 100 and a base segment 101. The distal end segment 100 is swaged and is thereby plastically deformed against the outer peripheral edge 75 while the outer peripheral edge 75 is clamped between the distal end segment 100 and the supporting base 77, and thereby the fixation portion 95 is formed. The outer peripheral edge 75 of the circuit board 71 is fixed relative to the upper case segment 61 by swaging, i.e., plastically deforming the distal end segment 100 against the outer peripheral edge 75. The base segment 101 limits movement of the outer peripheral edge 75 in the direction parallel to the plane of the circuit board 71. The fixation portions 95 of the circuit-board fixtures 91 position the circuit board 71 relative to the upper case segment 61.

The fixation portions 95 of the circuit-board fixtures 91 fix the outer peripheral edge 75 of the circuit board 71. In the circuit board 71, the outer peripheral edge 75 cannot be used as a space for mounting the electronic component(s) or placing a wiring(s). Therefore, it is not required to provide an additional structure, such as a through-hole, for fixing the circuit board 71 relative to the upper case segment 61.

In the second embodiment, advantages, which are similar to the advantages (1)-(4) and (6) of the first embodiment, can be achieved.

Third Embodiment

Figure 9:
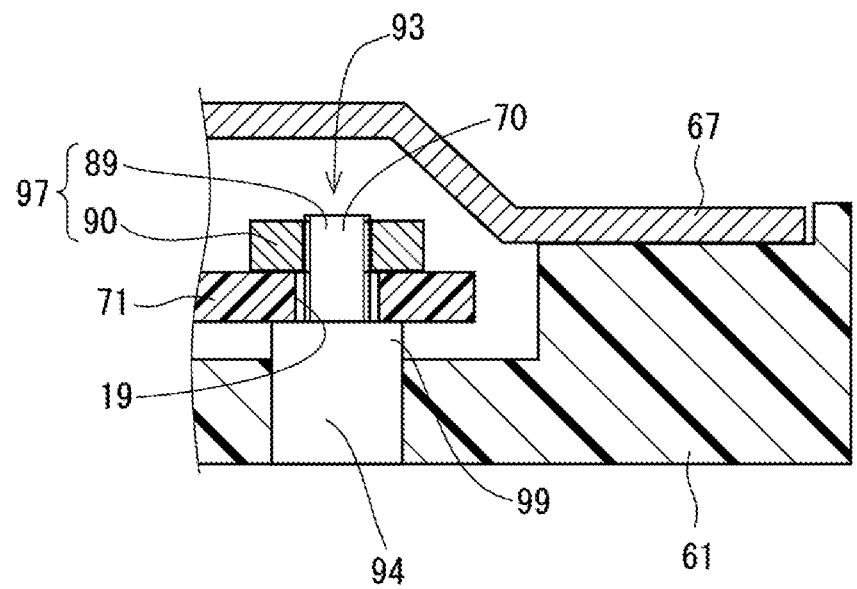
FIG. 9 is a schematic cross sectional view around a circuit-board fixture according to a third embodiment.

The third embodiment is similar to the first embodiment except the following construction. As shown in FIG. 9, a fixation portion (also referred to as a threaded fixation portion) 97 of each of the circuit-board fixtures 93 includes: a bolt 89, which is formed integrally in one piece with the insertion portion 94 made of aluminum, and a nut 90, which is made of aluminum and is threadably engaged with the bolt 89. The circuit board 71 has the plurality of holes 19, each of which extends through the circuit board 71 in the thickness direction of the circuit board 71. The bolt 89 is inserted through the hole 19 from the insertion portion 94 side toward the plate cover 67 side. The nut 90 is installed to and is threadably engaged with the bolt 89 while the circuit board 71 is clamped between the bolt 89 and the nut 90.

Figure 10:
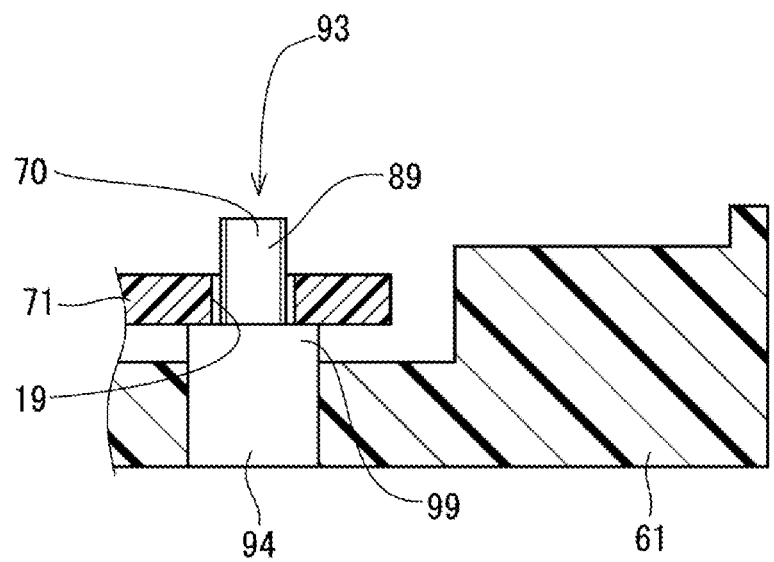
FIG. 10 is a schematic cross sectional view corresponding to FIG. 9 and showing a state before the time of fixing a fixation portion according to the third embodiment.

As shown in FIG. 10, the insertion portion 94 and the bolt 89 are formed integrally in one piece as an insert bolt, which is embedded at the upper case segment 61 through an insert molding process. The bolt 89 includes a male threaded part 70 and a cylindrical part 99. The cylindrical part 99 projects from the surface of the upper case segment 61 in the axial direction. The circuit board 71 is supported by the cylindrical part 99. When the nut 90 is threadably and securely engaged with the male threaded part 70, the circuit board 71 is securely clamped between the cylindrical part 99 and the nut 90. A diameter of the male threaded part 70 is smaller than the diameter of the hole 19. The male threaded part 70 limits movement of the circuit board 71 in a direction parallel to the plane of the circuit board 71. The fixation portions 97 of the circuit-board fixtures 93 position the circuit board 71 relative to the upper case segment 61.

The insertion portion 94 and the bolt 89 are formed integrally in one piece as an insert bolt, which is embedded at the upper case segment 61 through the insert molding process. Therefore, in comparison to a case where an insert nut is embedded at the upper case segment 61 by insert molding, a size of the insert component can be reduced.

In the third embodiment, advantages, which are similar to the advantages (1), (3) and (6) of the first embodiment, can be achieved.

Other Embodiments

In another embodiment, the shape of the swaging fixation portion may be, for example, a C-shape. In short, it is only required that the circuit board is fixed to the upper case segment by the fixation portions made of the metal.

In another embodiment, it is not necessary to place the circuit-board fixtures at the four corners, respectively, of the circuit board. For instance, the circuit-board fixtures may be placed at four sides, respectively, of the circuit board. Alternatively, a plurality of circuit-board fixtures may be placed at each of the four corners or each of the four sides of the circuit board.

In another embodiment, the circuit board is not necessarily made of glass epoxy and may be made of another material that is other than the glass epoxy. Furthermore, the fixation portion of each of the circuit-board fixtures is not necessarily made of aluminum and may be made of another material that is other than aluminum. For example, an aluminum alloy, magnesium, a magnesium alloy or the like may be used as the material of the fixation portion of each of the circuit-board fixtures. In such a case, each circuit-board fixture 92 of the first embodiment, each circuit-board fixture 91 of the second embodiment and each circuit-board fixture 93 (including the insertion portion 94, the bolt 89 and the nut 90) may be made of the aluminum alloy, magnesium, the magnesium alloy or the like. As long as the difference between the linear expansion coefficient of the circuit board and the linear expansion coefficient of the fixation portion is smaller than the difference between the linear expansion coefficient of the glass epoxy and the linear expansion coefficient of the iron, it is possible to obtain the advantage of limiting the generation of the thermal stress.

In another embodiment, the end surface of the insertion portion, which is opposite to the fixation portion, is not necessarily exposed at the surface of the case. Furthermore, even in the case where the end surface of the insertion portion is exposed at the surface of the case, the end surface of the insertion portion is not necessarily entirely exposed at the surface of the case and may be partially exposed at the surface of the case. Even in such a case, a part of the end surface can be supported at the time of swaging.

In another embodiment, the fixation portion is not necessarily limited to the swaging fixation portion or the threaded fixation portion and may be a press-fitting fixation portion or another type of fixation portion.

In another embodiment, the bolt is not necessarily the insert bolt, which is embedded at the upper case segment through the insert molding process, and the bolt may be a press-fitting bolt that is press fitted to the upper case segment.

The present disclosure should not be limited to the embodiments described above and may be implemented in various other forms without departing from the spirit of the present disclosure.

What is claimed is:

1. A rotary actuator for a shift-by-wire system of a vehicle, the rotary actuator comprising:
an electric motor;
a control unit, which is configured to control an operation of the electric motor;
a case that is made of resin and receives the electric motor; and
a circuit-board fixture that includes an insertion portion, which is insert molded in an opposed portion of the case, and a fixation portion, which is made of metal and fixes a circuit board of the control unit, wherein:
the fixation portion directly contacts the circuit board;
the opposed portion of the case is opposed to the circuit board in a direction perpendicular to a plane of the circuit board; and
the opposed portion of the case includes a hole extending in the direction perpendicular to the plane of the circuit board, and the insertion portion is insert molded into the opposed portion such that the insertion portion extends in the hole in the direction perpendicular to the plane of the circuit board, and an inner peripheral surface of the hole directly contacts an outer peripheral surface of the insertion portion.

2. The rotary actuator according to claim 1, wherein the fixation portion is swaged against the circuit board to fix the circuit board.

3. The rotary actuator according to claim 1, wherein:
the circuit board is made of glass epoxy; and
the fixation portion is made of aluminum or an aluminum alloy.

4. The rotary actuator according to claim 1, wherein the insertion portion extends through the hole in the direction perpendicular to the plane of the circuit board such that an end surface of the insertion portion, which is opposite to the fixation portion, is exposed at a surface of the case.

5. The rotary actuator according to claim 1, wherein the fixation portion extends through the circuit board in a thickness direction of the circuit board.

6. The rotary actuator according to claim 1, wherein the fixation portion fixes an outer peripheral edge of the circuit board.

7. The rotary actuator according to claim 1, wherein the fixation portion includes a connection, which has a male thread and is formed integrally with the insertion portion in one piece, and a nut, which has a female thread that is threadably engaged with the male thread of the connection.

8. The rotary actuator according to claim 1, wherein the fixation portion positions the circuit board relative to the case.

9. The rotary actuator according to claim 1, wherein the circuit board has an electronic device, and the circuit-board fixture is electrically insulated from the electronic device of the circuit board.

10. The rotary actuator according to claim 1, wherein the hole in the opposed portion of the case is coaxially aligned with a hole in the circuit board.

11. The rotary actuator according to claim 10, wherein the fixation portion extends through the hole in the circuit board.

* * * * *